(12) United States Patent
Lee et al.

(10) Patent No.: US 12,364,045 B2
(45) Date of Patent: Jul. 15, 2025

(54) IMAGE SENSING DEVICE

(71) Applicant: SK hynix Inc., Icheon-si (KR)

(72) Inventors: Kyoung In Lee, Icheon-si (KR); Yu Jin Park, Icheon-si (KR)

(73) Assignee: SK HYNIX INC., Icheon-si (KR)

(*) Notice: Subject to any disclaimer, the term of this patent is extended or adjusted under 35 U.S.C. 154(b) by 1036 days.

(21) Appl. No.: 17/354,155

(22) Filed: Jun. 22, 2021

(65) Prior Publication Data

US 2022/0102414 A1  Mar. 31, 2022

(30) Foreign Application Priority Data

Sep. 25, 2020  (KR) .................. 10-2020-0124439

(51) Int. Cl.
*H10F 39/00* (2025.01)
*H04N 25/571* (2023.01)
(Continued)

(52) U.S. Cl.
CPC ....... *H10F 39/8063* (2025.01); *H04N 25/573* (2023.01); *H04N 25/702* (2023.01);
(Continued)

(58) Field of Classification Search
CPC ......... H01L 27/14627; H01L 27/14621; H01L 27/14623; H01L 27/14643; H01L 27/14605; H01L 27/14603; H04N 25/573; H04N 25/702; H04N 25/704; H04N 25/585; H04N 25/589; H04N 9/01; H04N 25/134;
(Continued)

(56) References Cited

U.S. PATENT DOCUMENTS

2011/0049336 A1  3/2011  Matsunuma
2013/0161774 A1  6/2013  Okigawa
(Continued)

FOREIGN PATENT DOCUMENTS

CN  109309800 A  2/2019
CN  109863602 A  6/2019
(Continued)

OTHER PUBLICATIONS

3rd CN Office Action for CN Appl. No. 202110623788.1, mailed on Oct. 8, 2024, 14 pages.
(Continued)

*Primary Examiner* — Sinh Tran
*Assistant Examiner* — Zhenzhen Wu
(74) *Attorney, Agent, or Firm* — Perkins Coie LLP

(57) ABSTRACT

An image sensing device includes a plurality of pixel groups, each pixel group including first to fourth unit pixels that are configured to respond to incident light and generate electrical signals, and wherein each of the first to fourth unit pixels of a pixel group includes optical filters operable to transmit incident light corresponding to a same color, wherein the first unit pixel and the second unit pixel that are included in the pixel group are located adjacent to each other and include portions of a first microlens, and wherein a light reception area of the third unit pixel of the pixel group has a size smaller than a size of a light reception area of the fourth unit pixel of the pixel group.

14 Claims, 8 Drawing Sheets

(51) Int. Cl.
*H04N 25/702* (2023.01)
*H04N 25/704* (2023.01)

(52) U.S. Cl.
CPC ....... *H04N 25/704* (2023.01); *H10F 39/8053* (2025.01); *H10F 39/8057* (2025.01)

(58) Field of Classification Search
CPC ........ H04N 25/42; H04N 25/58; H04N 25/76; H04N 25/77; H04N 25/11; H10F 39/8063; H10F 39/8053; H10F 39/8057; H10F 39/8023; H10F 39/18; H10F 39/802
See application file for complete search history.

(56) References Cited

U.S. PATENT DOCUMENTS

| | | |
|---|---|---|
| 2013/0214371 A1 | 8/2013 | Asatsuma et al. |
| 2014/0306360 A1 | 10/2014 | Li et al. |
| 2015/0350583 A1* | 12/2015 | Mauritzson .......... H04N 25/134 257/432 |
| 2018/0026065 A1 | 1/2018 | Hsieh et al. |
| 2018/0352199 A1* | 12/2018 | Hwang ............... H10F 39/8053 |
| 2019/0019835 A1 | 1/2019 | Tanaka et al. |
| 2019/0281226 A1* | 9/2019 | Wang ................ H01L 27/14605 |
| 2020/0045223 A1 | 2/2020 | Pang et al. |
| 2020/0186723 A1* | 6/2020 | Kang .................... H04N 23/67 |
| 2020/0280704 A1* | 9/2020 | Galor Gluskin ....... H04N 25/58 |
| 2021/0120198 A1* | 4/2021 | Kim ................... H01L 27/1464 |

FOREIGN PATENT DOCUMENTS

| | | |
|---|---|---|
| CN | 110444550 A | 11/2019 |
| CN | 111131729 A | 5/2020 |
| JP | 2012182824 A | 9/2012 |
| JP | 2013197611 A | 9/2013 |
| KR | 20180133157 A | 12/2018 |
| KR | 20190012806 A | 2/2019 |
| WO | 2020171450 A1 | 8/2020 |

OTHER PUBLICATIONS

Request for the Submission of an Opinion for KR Appl. No. 10-2020-0124439, mailed on Dec. 16, 2024, 14 pages with English translation.

Second Office Action for CN Appl. No. 202110623788.1, mailed on Jun. 21, 2024, 23 pages with English translation.

* cited by examiner

IMAGE SENSING DEVICE

CROSS-REFERENCE TO RELATED APPLICATION

This patent document claims the priority and benefits of Korean patent application No. 10-2020-0124439, filed on Sep. 25, 2020, the disclosure of which is incorporated by reference in its entirety as part of the disclosure of this patent document.

TECHNICAL FIELD

The technology and implementations disclosed in this patent document generally relate to an image sensing device, and more particularly to an image sensor capable of performing a phase-difference detection autofocus (PDAF) function.

BACKGROUND

An image sensing device is used in electronic devices to convert optical images into electrical signals. The recent development of automotive, medical, computer and communication industries is leading to an increase in demand for higher-performance image sensing devices in various devices such as smartphones, digital cameras, camcorders, personal communication systems (PCSs), game consoles, surveillance cameras, medical micro-cameras, robots, infrared (IR) sensing devices, etc.

Complementary Metal Oxide Semiconductor (CMOS) image sensing devices are now widely used due to certain advantages including, e.g., higher frame rates and shutter speed. The CMOS image sensing devices and signal processing circuitry can be integrated into a single chip, making it possible to miniaturize electronic devices while achieving lower power consumption. In addition, using the CMOS fabrication technology can result in reduction in the production costs. Such characteristics of the CMOS image sensing devices make these sensors better suited for implementations in mobile devices.

SUMMARY

The embodiments of the disclosed technology relate to an image sensing device capable of performing a phase-difference detection autofocus (PDAF) function and a high dynamic range (HDR) imaging function.

Some embodiments of the disclosed technology relate to an image sensing device for receiving signals generated by a plurality of unit pixels included in one pixel group, and acquiring a high dynamic range (HDR) image by performing image capture only once using the received signals.

In accordance with an embodiment of the disclosed technology, an image sensing device may include a plurality of pixel groups, each pixel group including first to fourth unit pixels that are configured to respond to incident light and generate electrical signals, and wherein each of the first to fourth unit pixels of a pixel group includes optical filters operable to transmit incident light corresponding to a same color, wherein the first unit pixel and the second unit pixel that are included in the pixel group are located adjacent to each other and include portions of a first microlens, and wherein a light reception area of the third unit pixel of the pixel group has a size smaller than a size of a light reception area of the fourth unit pixel of the pixel group.

In some implementations, the optical filter is any one of a first optical filter configured to selectively pass red light, a second optical filter configured to selectively pass green light, or a third optical filter configured to selectively pass blue light.

In some implementations, a light reception area of the first unit pixel of the pixel group is identical in size to a light reception area of the second unit pixel of the pixel group.

In some implementations, the first unit pixel and the second unit pixel that are included in the pixel group are located adjacent to each other in a row direction of the pixel group.

In some implementations, the first unit pixel and the second unit pixel that are included another pixel group adjacent to the pixel group in the row direction include portions of another first microlens, and wherein the first microlenses of the pixel group and another first microlens of another pixel group are disposed in different rows.

In some implementations, the first unit pixel and the second unit pixel that are included another pixel group adjacent to the pixel group in a column direction include portions of another first microlens, and the first microlens of the pixel group is disposed in a first row of the pixel group and another first microlens of another pixel group is disposed in a first row of another pixel group.

In some implementations, the first unit pixel and the second unit pixel that are included in the pixel group are located adjacent to each other in a column direction of the pixel group.

In some implementations, the first unit pixel and the second unit pixel that are included another pixel group adjacent to the pixel group in the column direction include portions of another first microlens, and wherein the first microlens of the pixel group and another first microlens of another pixel group are disposed in different columns.

In some implementations, the first unit pixel and the second unit pixel that are included another pixel group adjacent to the pixel group in the row direction include portions of another first microlens, and wherein the first microlens of the pixel group is disposed in a first column of the pixel group and another first microlens of another pixel group is disposed in a first column of another pixel group.

In some implementations, each of the pixel groups may include a first light shielding structure formed along an outer edge of the third unit pixel and a second light shielding structure formed along an outer edge of the fourth unit pixel, wherein the first light shielding structure has a larger width than the second light shielding structure.

In some implementations, each of the pixel groups may further include a third light shielding structure formed along outer edges of the first unit pixel and the second unit pixel, wherein the third light shielding structure has a smaller width than the second light shielding structure.

In some implementations, the third unit pixel and the fourth unit pixel include a second microlens and a third microlens, respectively.

In some implementations, the first microlens is formed to have a higher height than either the second microlens or the third microlens.

In accordance with another embodiment of the disclosed technology, an image sensing device may include a pixel array including pixel groups, each pixel group including unit pixels arranged in a (2×2) matrix and configured to respond to incident light and generate a signal corresponding to the incident light and a processor electrically coupled to the pixel groups and configured to process the signal generated by unit pixels included in the pixel groups, wherein each pixel groups further includes first to fourth unit pixels that include optical filters configured to transmit incident light of a same color, a microlens disposed to overlap with the first unit pixel and the second unit pixel, and wherein a light reception area of the third unit pixel has a size smaller than a size of a light reception area of the fourth unit pixel, wherein the processor is configured to generate phase difference data indicative of a phase difference between a first path for the incident light to reach the first unit pixel and a second path for the incident light to reach the second unit pixel.

In some implementations, the processor is configured to operate to generates first image data based on the signals generated by the first unit pixel and the second unit pixel.

In some implementations, the processor is further configured to generate second image data based on the signal generated by the third unit pixel, and generates third image data based on the signal generated by the fourth unit pixel.

In some implementations, the processor is configured to generate a high dynamic range (HDR) image using the first to third image data.

It is to be understood that both the foregoing general description and the following detailed description of the disclosed technology are illustrative and explanatory and are intended to provide further explanation of the disclosure as claimed.

BRIEF DESCRIPTION OF THE DRAWINGS

The above and other features and beneficial aspects of the disclosed technology will become readily apparent with reference to the following detailed description when considered in conjunction with the accompanying drawings.

DETAILED DESCRIPTION

Figure 1:
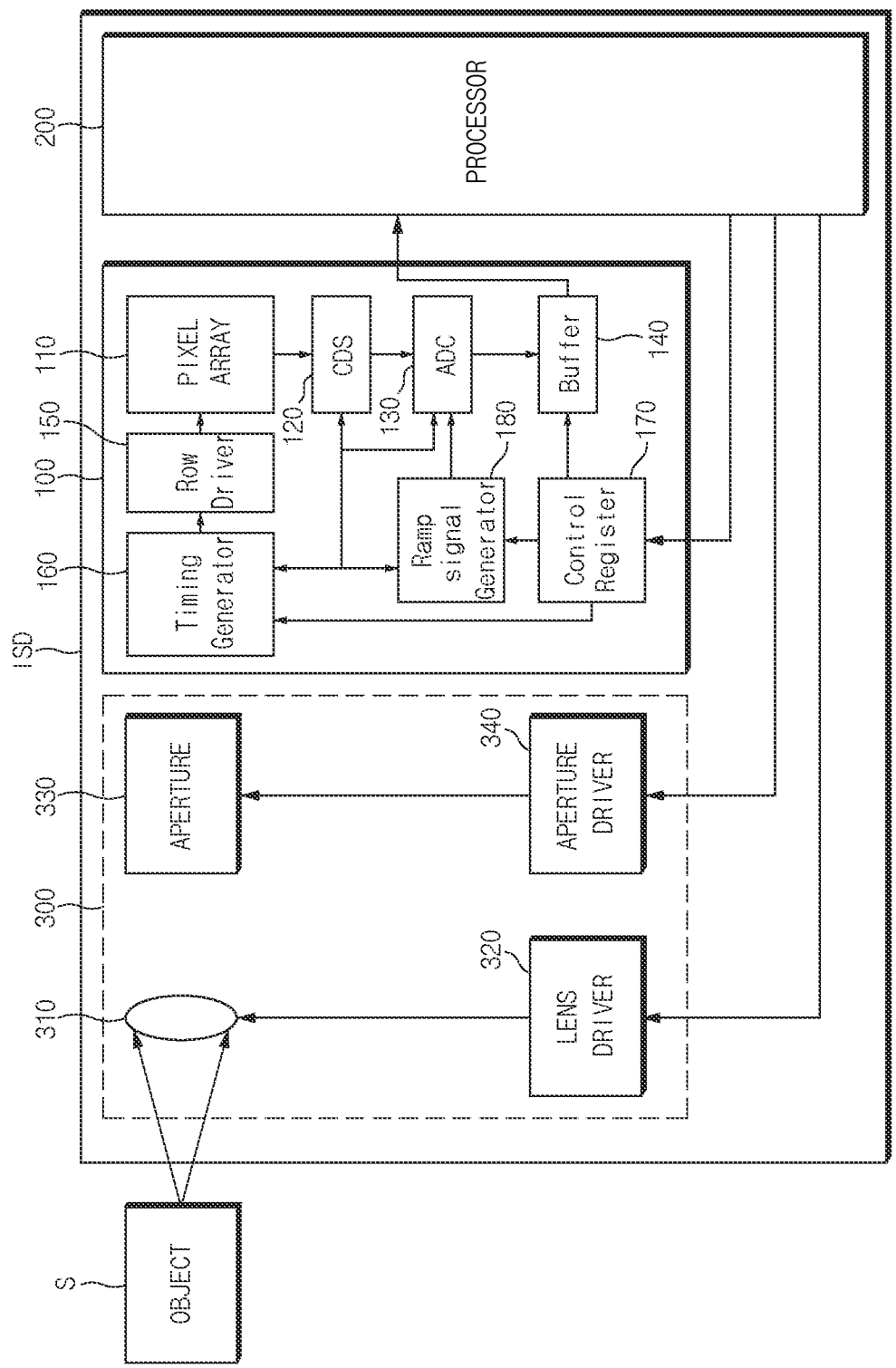
FIG. 1 is a block diagram illustrating an example of an image sensing device based on some implementations of the disclosed technology.

The image sensing device may have a phase-difference detection autofocus (PDAF) function that performs automatic focusing using a phase difference between detected images. The image sensing device may perform high dynamic range (HDR) imaging that acquires a plurality of image data for different illuminance environments, processes the acquired image data, synthesizes the processed image data, and thus forms a high dynamic range (HDR) image. However, when forming the HDR image using a plurality of independently acquired image data, a time delay may occur in acquiring and processing the image data and motion artifacts between the acquired image data can also occur.

Some implementations of the disclosed technology relate to an image sensing device capable of performing a phase-difference detection autofocus (PDAF) function and a high dynamic range (HDR) imaging function. Some implementations of the disclosed technology relate to an image sensing device for receiving signals generated by a plurality of unit pixels included in one pixel group, and acquiring a high dynamic range (HDR) image by performing image capture only once using the received signals. Some implementations of the disclosed technology provide an image sensing device which can perform the phase-difference detection autofocus (PDAF) function, and can generate the high dynamic range (HDR) image using a plurality of signals generated by one pixel group. Some implementations of the disclosed technology provide an image sensing device which can use a plurality of signals generated by one pixel group, and can perform a single signal detection operation for the unit pixels contained in the pixel array. Some implementations of the disclosed technology enables to provide a higher-quality HDR image.

Reference will now be made in detail to the embodiments of the disclosed technology, examples of which are illustrated in the accompanying drawings. While the disclosure is susceptible to various modifications and alternative forms, specific embodiments thereof are shown by way of example in the drawings. However, the disclosure should not be construed as being limited to the embodiments set forth herein.

Wherever possible, the same reference numbers will be used throughout the drawings to refer to the same or similar parts. In the following description, a detailed description of related known configurations or functions incorporated herein will be omitted to avoid obscuring the subject matter.

FIG. 1 is a block diagram illustrating an example of an image sensing device ISD based on some implementations of the disclosed technology. In more detail, FIG. 1 illustrates an example of a method for performing an autofocus (AF) function by the image sensing device ISD and a method for forming high dynamic range (HDR) image data by the image sensing device ISD.

Referring to FIG. 1, the image sensing device ISD may include an image pickup circuit 300, an image sensor 100, and a processor 200.

The image pickup circuit 300 may receiving light. In more detail, the image pickup circuit 300 may include a lens 310, a lens driver 320, an aperture 330, and an aperture driver 340.

The lens 310 may be implemented as a single lens, or may also be implemented as a plurality of lenses as necessary.

The lens driver 320 may control the position of the lens 310 based on a control signal from the processor 200. As the position of the lens 310 is adjusted (or changed), the distance between the lens 310 and an object (S) (i.e., a target object) can also be adjusted (or changed).

The aperture 330 may adjust or control the amount of light to be incident upon the lens 310 based on a control signal from the aperture driver 340. Since the amount of light (i.e., the amount of reception light) to be incident upon the lens 310 is adjusted through the aperture 330, the magnitude of signals generated by the image sensor 100 can also be adjusted in response to the adjusted amount of light.

The aperture driver 340 may adjust the value of the aperture 330, such that the aperture driver 340 can adjust the amount of light to be incident upon the lens 310 using the adjusted value of the aperture 330.

The processor 200 may transmit a signal for adjusting the position of the lens 310 based on signals generated by the image sensor 100 to the lens driver 320, or may transmit a signal for adjusting a value of the aperture 330 to the aperture driver 340.

The image sensor 100 may include a pixel array 110, a correlated double sampler (CDS) 120, an analog-to-digital converter (ADC) 130, a buffer 140, a row driver 150, a timing generator 160, a control register 170, and a ramp signal generator 180.

In some implementations, the pixel array 110 may include at least one pixel group. The pixel group may include a plurality of unit pixels arranged in a (2×2) matrix.

Incident light (i.e., an optical signal) having penetrated the lens 310 and the aperture 330 may be imaged by the pixel array 110, such that the incident light can be converted into electrical signals. The unit pixels may generate electrical signals corresponding to the external object (S), respectively.

The unit pixels included in the pixel array 110 may absorb light to generate charges, and may output electrical signals for the generated charges to the correlated double sampler (CDS) 120.

Each of the unit pixels contained in the pixel array 110 may include a microlens, an optical filter, a photoelectric conversion element, and a wiring layer.

The microlens may allow light incident upon the pixel array 110 to converge upon the optical filter and the photoelectric conversion element. The optical filter may enable the incident light having penetrated the microlens to selectively pass therethrough based on wavelengths of the incident light.

The photoelectric conversion element may generate photocharges corresponding to incident light that has penetrated the microlens and the optical filter. Each of the photoelectric conversion elements may be implemented as a photodiode, a phototransistor, a photogate, a pinned photodiode (PPD), or a combination thereof. In the following descriptions, it is assumed that each photoelectric conversion element is implemented as a photodiode as an example.

If the photoelectric conversion element is a photodiode, the photoelectric conversion element may include a stacked structure in which an N-type impurity region and a P-type impurity region are vertically stacked. The photoelectric conversion element may be formed in a semiconductor substrate. For example, the semiconductor substrate may be a P-type semiconductor substrate.

The wiring layer may be disposed below the photoelectric conversion element. Here, the wiring layer may also be called a line layer as needed. The wiring layer may include a reset transistor, a transfer transistor, a floating diffusion (FD) region, a drive transistor, a selection transistor, etc.

The reset transistor may be activated in response to a reset signal, such that the reset transistor may reset the potential of each unit pixel to a predetermined voltage level (e.g., a pixel voltage level).

In addition, when the reset transistor is activated, the transfer transistor may also be activated to reset the floating diffusion (FD) region.

Since the transfer transistor is activated in response to a transmission (Tx) signal, the transfer transistor can transmit photocharges accumulated in the photoelectric conversion element of each pixel to the floating diffusion (FD) region.

The floating diffusion (FD) region may receive photocharges generated by the photoelectric conversion element, may accumulate the received photocharges, and may thus convert the accumulated photocharges into a voltage signal.

The drive transistor may receive a pixel voltage through a drain terminal thereof, and may be coupled to the floating diffusion (FD) region through a gate terminal thereof. In addition, the drive transistor may be coupled to the selection transistor through a source terminal thereof.

The drive transistor may output a current corresponding to the voltage of the floating diffusion (FD) region coupled to a gate electrode thereof to a signal line through the selection transistor.

The selection transistor may be activated in response to a selection signal applied to a gate electrode thereof, such that the selection transistor may transmit an output signal of the drive transistor to a signal line. The electrical signals applied to the signal line may be provided to the correlated double sampler (CDS) 120.

The correlated double sampler (CDS) 120 may sample and hold electrical signals received from the pixel array 110. The correlated double sampler (CDS) 120 may perform double sampling of a signal level caused by incident light and a specific noise level, and may thus output a signal level corresponding to a difference between the sampling resultant signals.

The analog-to-digital converter (ADC) 130 may convert the received analog signal into a digital signal, and may transmit the digital signal to the buffer 140.

The buffer 140 may latch the received digital signals, and may sequentially output the latched digital signals to the processor 200. The buffer 140 may include a memory for latching the digital signal and a sense amplifier for amplifying the digital signal.

The row driver 150 may drive the plurality of unit pixels contained in the pixel array 110 in response to an output signal of the timing generator 160.

For example, the row driver 150 may generate a selection signal to select any one of the row lines. In addition, the row driver 150 may generate signals (e.g., a transfer-transistor drive signal, a reset-transistor drive signal, a selection-transistor drive signal, etc.) to drive transistors contained in the unit pixels.

The timing generator 160 may control the row driver 150, such that the pixel array 110 can accumulate charges by absorbing light, can temporarily store the accumulated charges, or can output an electrical signal corresponding to the stored charges to the outside of the pixel array 110.

The timing generator 160 may control the correlated double sampler (CDS) 120 to sample and hold electrical signals received from the pixel array 110.

The control register 170 may generate control signals to control the buffer 140, the timing generator 160, and the ramp signal generator 180 based on the signal received from the processor 200.

The ramp signal generator 180 may generate a reference signal that enables the analog-to-digital converter (ADC) 130 to detect a signal in response to a control signal received from the timing generator 160.

The processor 200 may receive an input signal that is output from the buffer 140 and generate image data or phase difference data based on the received input signal. As described above, the processor 200 may transmit a control signal for the aperture driver 340 using the image data. In addition, the processor 200 may transmit a control signal for the lens driver 320 using the phase difference data.

In the descriptions below, an operation mode in which the processor 200 generates the phase difference data may be referred to a first mode and another operation mode in which the processor 200 generates the image data may be referred to a second mode.

In the first mode, the processor 200 may generate phase difference data for the external object (S) using signals generated by some unit pixels sharing one microlens among a plurality of unit pixels contained in a pixel group.

Some unit pixels sharing one microlens are located adjacent to one another in a row direction or a column direction of the pixel array 110 and includes at least a portion of one microlens.

For example, it can be assumed that a predetermined number of pixel groups, each of which includes two unit pixels sharing a single microlens, are disposed over the pixel array. In addition, it can be assumed that two unit pixels sharing the single microlens are arranged adjacent to each other in a row direction of the pixel array.

The processor 200 may calculate signals generated by pixels located at the left side of the center point of the pixel group, and generate first phase data for the object (S) using the calculated signals. Similarly, the processor 200 may calculate signals generated by pixels located at the right side of the center point of the pixel group, and generate second phase data for the object (S) using the calculated signals.

If the distance between the lens 310 and the object (S) is considered to be "in-focus position", incident lights which have passed through one microlens and reached the unit pixels may have the same magnitude. Thus, the signals detected by the unit pixels sharing one microlens may have the same magnitude. Therefore, when the distance between the lens 310 and the object (S) satisfies the in-focus position, first phase data and second phase data generated by the processor 200 may be identical to each other.

When the distance between the lens 310 and the object (S) does not satisfy the in-focus position, incident light beams which have passed through one microlens and reached the unit pixels may have different intensities (e.g., magnitudes) from each other. Thus, different intensities of light may reach the respective unit pixels after passing through one microlens. This is because paths to arrive for the incident light beams to the unit pixels are different from each other. As a result, signals respectively detected by the unit pixels sharing one microlens may have different intensities.

In this case, the first phase data and the second phase data are different by a predetermined phase. Thus, there is a phase difference between the first phase data and the second phase data.

If the distance between the lens 310 and the object (S) does not satisfy the in-focus position, the processor 200 may calculate a phase difference between the first phase data and the second phase data, and generate phase difference data.

The processor 200 may generate phase difference data using the above signals, may provide a control signal for the lens driver 320 based on the phase difference data, and may thus adjust the distance between the object (S) and the lens 310 and the distance between the pixel array 110 and the lens 310 using the control signal.

Image data may be generated in response to light incident from the object (S) to the image sensor 100, and may be used as a signal for adjusting the aperture 330. In addition, the processor 200 may acquire a high dynamic range (HDR) image by calculating image data acquired from the plurality of unit pixels.

The processor 200 may receive an output signal of the buffer 140, and may generate image data during the second mode using the received signal.

The processor 200 may generate a plurality of image data for the external object (S) using signals respectively generated by the unit pixels contained in the pixel group.

In the second mode, the processor 200 may generate image data using signals generated by two unit pixels sharing one microlens. Further, in the second mode, the processor 200 may generate image data using signals generated by the unit pixels having different light reception areas (regions).

A detailed description of the second mode for generating image data will hereinafter be given in detail with reference to FIG. 2.

When a plurality of image data is generated using signals generated by the unit pixels contained in one pixel group, the plurality of image data may correspond to different illuminance environments. Accordingly, the processor 200 may generate a high dynamic range (HDR) image by using (for example, synthesizing or calculating) the plurality of image data.

In addition, the processor 200 may perform a variety of image signal processing for improving image quality, such as noise correction (or noise cancellation) of image information, interpolation between adjacent pixels, etc.

Although the processor 200 shown in FIG. 1 is located outside the image sensor 100, other implementations are also possible. For example, the processor 200 can be located inside the image sensor 100 or can be separately located outside the image sensing device ISD.

Figure 2:
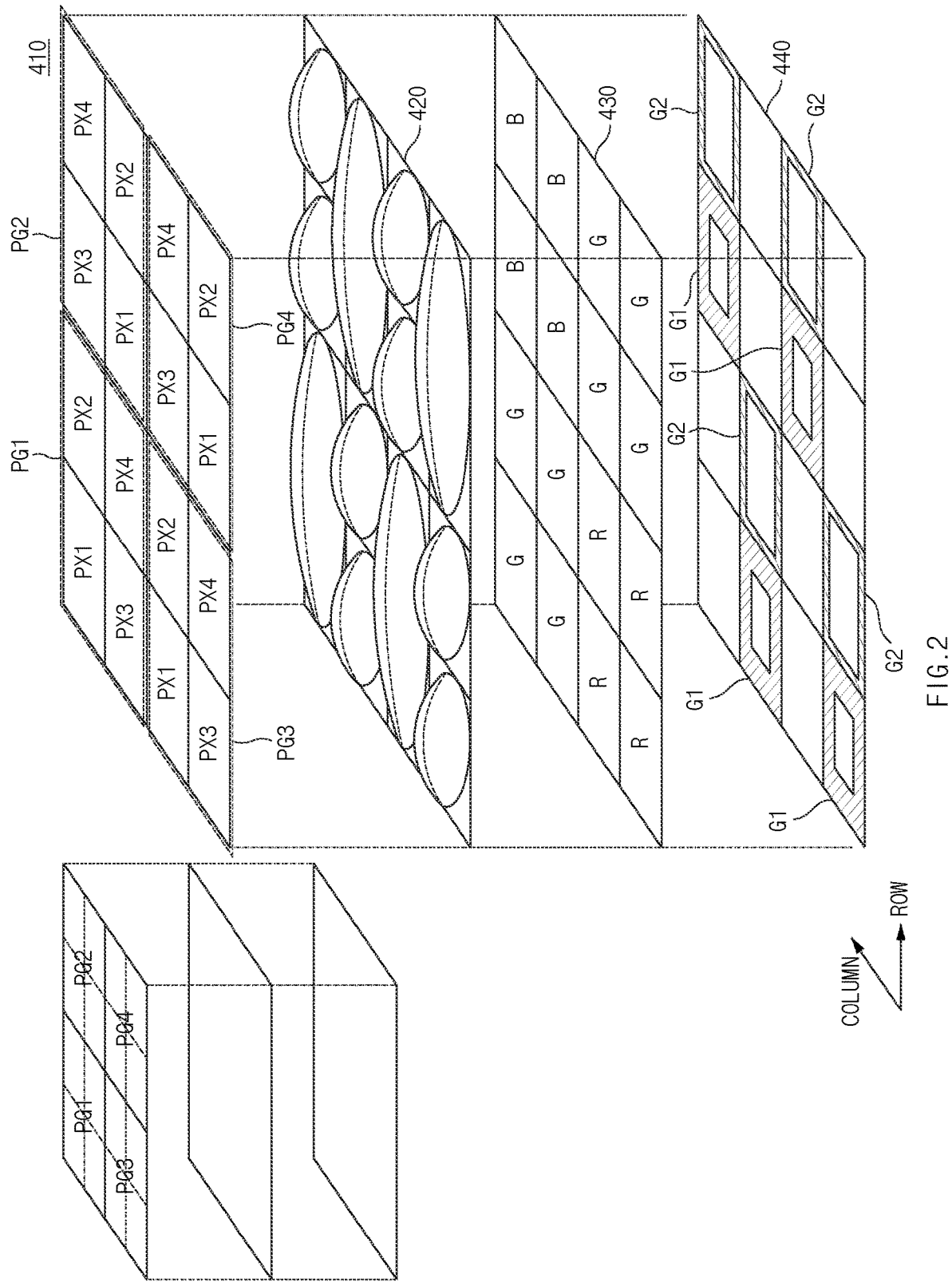
FIG. 2 is a perspective view illustrating an example of a pixel array based on some implementations of the disclosed technology.

FIG. 2 is a perspective view illustrating an example of a pixel array 410 based on some implementations of the disclosed technology.

Referring to FIG. 2, the pixel array 410 may include a first pixel group PG1, a second pixel group PG2, a third pixel group PG3, and a fourth pixel group PG4. Each of the pixel groups PG1, PG2, PG3, and PG4 may include a first unit pixel PX1, the second unit pixel PX2, a third unit pixel PX3, and a fourth unit pixel PX4. The pixel group 410 may have a specific structure in which the first pixel group PG1, the second pixel group PG2, the third pixel group PG3, and the fourth pixel group PG4 are repeatedly arranged.

The unit pixels PX1, PX2, PX3, and PX4 contained in one pixel group PG1, PG2, PG3, or PG4 may be arranged in a (2×2) matrix over the pixel array 410. Thus, each of the pixel groups PG1, PG2, PG3, and PG4 may include two rows and two columns.

In each pixel group PG1, PG2, PG3, or PG4, a row located at an upper side of the center of each pixel group PG1, PG2, PG3, or PG4 may be referred to a first row, and a row located at a lower side of the center of each pixel group PG1, PG2, PG3, or PG4 may be referred to a second row. In addition, a column located at the left side of the center of each pixel group PG1, PG2, PG3, or PG4 may be referred to a first column, and a column located at the right side of the center of each pixel group PG1, PG2, PG3, or PG4 may be referred to a second column.

In each pixel group PG1, PG2, PG3, or PG4, when two unit pixels contained in the same pixel group and are adjacent to each other in the row direction of the pixel group share a first microlens ML1, one unit pixel located at the left side of the center of each pixel group PG1, PG2, PG3, or PG4 may be referred to the first unit pixel PX1, and one unit pixel located at the right side of the center of each pixel group PG1, PG2, PG3, or PG4 may be referred to the second unit pixel PX2.

In other implementations of the disclosed technology, the first unit pixel PX1 and the second unit pixel PX2 may be arranged along other directions than the row direction of the pixel array 410.

In the example in which two unit pixels contained in the same pixel group and are adjacent to each other in the column direction of the pixel group 410 share the first microlens ML1, one unit pixel located at the upper side of the center of each pixel group PG1, PG2, PG3, or PG4 may be referred to the first unit pixel PX1, and one unit pixel located at the lower side of the center of each pixel group PG1, PG2, PG3, or PG4 may be referred to the second unit pixel PX2.

In addition, among the remaining unit pixels other than the first unit pixel PX1 and the second unit pixel PX2, one unit pixel having a relatively smaller light reception region may be referred to the third unit pixel PX3 and one unit pixel having a relatively larger light reception region may be referred to the fourth unit pixel PX4. In one pixel group PG_A, PG_B, PG_C, or PG_D, the third unit pixel PX3 and the fourth unit pixel PX4 may be interchanged in position as needed. The light reception area of each unit pixel may refer to an area through which incident light can pass. The light reception area my correspond to a portion of a total area of each unit pixel.

In some implementations of the disclosed technology, two unit pixels adjacent to each other in the row direction of each pixel group may share the first microlens ML1.

In the pixel groups adjacent to each other in the row direction of the pixel array 410, the first unit pixels (PX1) and the second unit pixels (PX2) may be disposed at different rows of the pixel array 410. Therefore, in the pixel groups adjacent to each other in the row direction of the pixel array 410, the first microlenses (ML1) may be disposed at different rows of the pixel array 410.

For example, the first unit pixel PX1 and the second unit pixel PX2 contained in the first pixel group PG1 may be disposed at the first row of the first pixel group PG1, while the first unit pixel PX1 and the second unit pixel PX2 contained in the second pixel group PG2 may be disposed at the second row of the second pixel group PG2.

In each of the pixel groups adjacent to each other in the column direction of the pixel array 410, a relative position of a row in which the first unit pixel (PX1) and the second unit pixel (PX2) are disposed may be same in a corresponding pixel group. Accordingly, in each of the pixel groups adjacent to each other in the column direction of the pixel array 410, a relative position of a row in which the first microlens (ML1) is disposed may be same in a corresponding pixel group.

For example, the first unit pixel PX1 and the second unit pixel PX2 contained in the first pixel group PG1 may be disposed at the first row of the first pixel group PG1. In addition, the first unit pixel PX1 and the second unit pixel PX2 contained in the third pixel group PG3 may be disposed at the first row of the third pixel group PG3.

In other implementations of the disclosed technology, two unit pixels adjacent to each other in the column direction of each pixel group may share the first microlens.

In the pixel groups adjacent to each other in the column direction of the pixel array, the first unit pixels and the second unit pixels contained in different pixel groups may be disposed at different columns in the adjacent pixel groups. Therefore, in the pixel groups adjacent to each other in the column direction of the pixel array, the first microlenses disposed in the column directions of the adjacent pixel groups may be disposed at different columns in the adjacent pixel groups.

For example, the first unit pixel and the second unit pixel contained in the first pixel group may be disposed at the first column of the first pixel group, while the first unit pixel and the second unit pixel contained in the second pixel group may be disposed at the second column of the second pixel group.

In each of the pixel groups adjacent to each other in the row direction of the pixel array, a relative position of a column in which the first unit pixel and the second unit pixel are disposed may be same within a corresponding pixel group. Therefore, in each of the pixel groups adjacent to each other in the row direction of the pixel array, a relative position of a column in which the first microlens is disposed may be same within a corresponding pixel group.

For example, the first unit pixel and the second unit pixel contained in the first pixel group may be disposed at the first column of the first pixel group, and the first unit pixel and the second unit pixel contained in the third pixel group may be disposed at the first column of the third pixel group.

The pixel array 410 may include a microlens array 420, an optical filter array 430, and a light shielding structure array 440.

The microlens array 420 may include a plurality of microlenses ML1, ML2, and ML3. The microlenses ML1, ML2, and ML3 may enable light incident upon the pixel array 410 to be directed to photoelectric conversion elements (not shown) disposed below the microlens array 420.

As described above, each of the first unit pixel PX1 and the second unit pixel PX2, that are contained in the same pixel group and are adjacent to each other in the row or column direction of the pixel array 410, may include at least a portion of the first microlens ML1. In this case, at least a portion of the first microlens ML1 may be formed to overlap with the first unit pixel PX1 and the second unit pixel PX2.

Each of the first unit pixel PX1 and the second unit pixel PX2 may generate a signal corresponding to incident light that has reached the photoelectric conversion elements (not shown) after passing through the first microlens ML1 and the optical filter.

As illustrated in FIG. 1, the first microlens ML1 is formed to overlap with the first unit pixel PX1 and the second unit pixel PX2. As a result, when the lens 310 is not located at the in-focus position, a first path for incident light having reached the photoelectric conversion element (not shown) of the first unit pixel PX1 is different from a second path for incident light having reached the photoelectric conversion element (not shown) of the second unit pixel PX2.

Due to the above-mentioned path difference, a difference may occur between a first signal generated by the first unit pixel PX1 in response to incident light and a second signal generated by the second unit pixel PX2 in response to incident light.

In the first mode for generating image data, the processor 200 may generate not only first phase data obtained by calculating signals generated from the first unit pixels (PX1) of the pixel groups PG1, PG2, PG3, and PG4, but also second phase data obtained by calculating signals generated from the second unit pixels (PX2) generated from the second unit pixels (PX2) of the pixel groups PG1, PG2, PG3, and PG4. The processor 200 may generate phase difference data by calculating the first phase data and the second phase data.

The processor 200 may output a control signal for the lens driver 320 using the phase difference data, thereby performing the phase-difference detection autofocus (PDAF) function.

In the second mode for generating the phase difference data, the processor 200 may generate image data using a first signal generated by the first unit pixel PX1 and a second signal generated by the second unit pixel PX2.

In the second mode, the processor 200 may perform binning of the first signal generated by the first unit pixel PX1 and the second signal generated by the second unit pixel PX2 in a situation in which the first unit pixel PX1 and the second unit pixel PX2 are contained in one pixel group PG1, PG2, PG3, or PG4. Here, the first unit pixel PX1 and the second unit pixel PX2 may share one microlens.

The binning of signals may include acquiring data of at least one pixel by summing or averaging output signals of adjacent pixels.

For example, an average value of the signal generated by the first unit pixel PX1 contained in the first pixel group PG1 and the signal generated by the second unit pixel PX2 in a situation in which the first unit pixel PX1 and the second unit pixel PX2 are contained in the first pixel group PG1 may correspond to an average value of incident light applied to the first unit pixel PX1 and incident light applied to the second unit pixel PX2.

Accordingly, the processor 200 may generate image data for the object (S) using the average value of the signals generated by the first and second unit pixels PX1 and PX2 that are contained in each of the pixel groups PG1, PG2, PG3, and PG4 and share one first microlens ML1.

In the second mode, when the processor 200 generates image data for the object (S) using the average value of the signal generated by the first unit pixel PX1 and the signal generated by the second unit pixel PX2, the generated image data may be considered to be first image data.

In the second mode, the processor 200 may calculate the signals generated by the first and second unit pixels PX1 and PX2 for each pixel group PG1, PG2, PG3 or PG4.

The third unit pixel PX3 and the fourth unit pixel PX4 may include a second microlens ML2 and a third microlens ML3, respectively. In some implementations, the second microlens ML2 and the third microlens ML3 may have the same shape. In addition, the first microlens ML1 may be formed higher than each of the second microlens ML2 and the third microlens ML3.

As the first microlens ML1 is formed higher than each of the second microlens ML2 and the third microlens ML3, the amount of incident light applied to the first and second unit pixels PX1 and PX2 may be greater than the amount of incident light applied to the third or fourth unit pixel PX3 or PX4. In other words, sensitivity to incident light applied to the respective unit pixels PX1, PX2, PX3, and PX4 may be changed according to shapes of such microlenses.

In the second mode, the processor 200 may generate second image data based on signals generated by the third unit pixels. In addition, the processor 200 may generate third image data based on signals generated by the fourth unit pixels (PX4).

The optical filter array 430 may be formed below the microlens array 420. The optical filter array 430 may include a plurality of optical filters R, G, and B.

The optical filters R, G, and B may enable incident lights guided by the microlens array 420 to selectively pass therethrough according to wavelengths of the incident lights.

From among the optical filters contained in the optical filter array 430, the optical filter configured to pass red light may refer to a first optical filter (R), the optical filter configured to pass green light may refer to a second optical filter (G), and the optical filter configured to pass blue light may refer to a third optical filter (B).

The first to third optical filters R, G, and B may be arranged in quad Bayer pattern over the optical filter array 430.

The quad Bayer pattern may refer to an extension of the Bayer pattern. The Bayer pattern may refer to a pattern in which one first optical filter (R), two second optical filters (Gs), and one third optical filter (B) are arranged in a matrix and two second optical filter (Gs) are arranged in a diagonal direction.

The quad Bayer pattern may refer to a pattern in which the first optical filters (Rs) construct the (2×2) matrix, the second optical filters (Gs) construct the (2×2) matrix, and the third optical filters (Bs) construct the (2×2) matrix such that the 2×2 matrices composed of the respective optical filters can construct the Bayer pattern.

The unit pixels contained in the same pixel group may include the same optical filters Rs, Gs, or Bs. For example, all of the unit pixels PX1, PX2, PX3, and PX4 contained in the first pixel group PG1 may include the second optical filters (Gs).

The light shielding structure array 440 may be used to reduce crosstalk between the adjacent unit pixels PX1, PX2, PX3, and PX4 and to adjust the amount of reception light. The light shielding structure array 440 may include metal, for example, tungsten (W) or others.

Although the light shielding structure array 440 is shown separately from the optical filter array 430 in FIG. 2, other implementations are also possible. In some implementations, the optical filter array 430 may overlap with the light shielding structure array 440 and the light shielding structure array 440 may be inserted into a predetermined region of the optical filter array 430.

For example, one surface of the light shielding structure array 440 may be formed at the same vertical position distanced from one surface of a semiconductor substrate (not shown) in which the optical filter array 430 and the photoelectric conversion elements (not shown) are formed. The optical filter array 430 may overlap with the other surface of the light shielding structure array 440.

The light reception areas of the unit pixels PX1, PX2, PX3, and PX4 may have sizes based on the shape of the light shielding structure array 440. As the light reception areas of the unit pixels PX1, PX2, PX3, and PX4 have different sizes, sensitivity of each of the unit pixels PX1, PX2, PX3, and PX4 receiving incident light may also be different.

The light shielding structure array 440 may include a first light shielding structure G1 and a second light shielding structure G2.

The first light shielding structure G1 may be formed along an outer edge of the third unit pixel PX3. The first light shielding structure G1 may optically isolate the third unit pixel PX3 from adjacent unit pixels.

The second light shielding structure G2 may be formed along an outer edge of the fourth unit pixel PX4. The second light shielding structure G2 may optically isolate the fourth unit pixel PX4 from adjacent unit pixels.

The first light shielding structure G1 may have a larger width than the second light shielding structure G2. As the first light shielding structure G1 is formed to have a larger width than the second light shielding structure G2, the third unit pixel PX3 may have a smaller light reception area than the fourth unit pixel PX4.

In the case of using a unit pixel having a smaller light reception area, the unit pixel has a lower sensitivity to incident light, such that the magnitude of an output signal of the unit pixel reacting to the incident light may be lower than the magnitude of an output signal of another unit pixel having a larger light reception area.

The third unit pixel PX3 and the fourth unit pixel PX4 contained in the first pixel group PG1 are formed to have different sizes of light reception areas, such that sensitivities of the third unit pixel PX3 and the fourth unit pixel PX4 can be different, which makes possible to acquire different magnitudes of signals from the third unit pixel PX3 and the fourth unit pixel PX4.

The processor 200 may generate a plurality of image data using a plurality of signals corresponding to different exposure levels of incident light, and may generate a high dynamic range (HDR) image by synthesizing or calculating the generated plurality of image data. In the conventional technologies, to obtain a high dynamic range (HDR) image, a plurality of frames corresponding to different exposure levels of incident light may be required. Here, the term "frame" may refer to or include an image obtained by a single detecting operation of detecting output signals of the unit pixels contained in the pixel array, and thus multiple detecting operations are required to obtain the plurality of frames corresponding to different exposure levels of the incident light.

Unlike the conventional technologies requiring multiple detecting operations, the image sensing device based on some implementations of the disclosed technology can detect signals of the plurality of unit pixels contained in the pixel array by only a single detecting operation, and generate signals corresponding to different exposure levels of incident light upon receiving the signals detected by the plurality of unit pixels contained in one pixel group. As a result, the image sensing device ISD based on some implementations of the disclosed technology can acquire the high dynamic range (HDR) image using only one frame.

In some implementations, no light shielding structure may be formed in each of the first unit pixel PX1 and the second unit pixel PX2. As the light shielding structure is not formed in each of the first unit pixel PX1 and the second unit pixel PX2, sufficient-sized light reception areas of the first unit pixel PX1 and the second unit pixel PX2 can be obtained.

In addition, the light reception area of the first unit pixel PX1 may be identical in size to the light reception area of the second unit pixel PX2.

As described above, the first unit pixels (PX1) and the second unit pixels (PX2) contained in the pixel groups adjacent to each other in the row direction of the pixel array 410 may be disposed at different rows in the respective pixel groups PG1, PG2, PG3, and PG4. In each of the pixel groups adjacent to each other in the column direction of the pixel array 410, a relative position of a row in which the first unit pixel (PX1) and the second unit pixel (PX2) are disposed may be same within a corresponding pixel group. Thus, first unit pixel PX1 may be located between the third unit pixels (PX3) and second unit pixel PX2 may be located between the fourth unit pixels (PX4).

Therefore, although the light shielding structure is not formed in each of the first unit pixel PX1 and the second unit pixel PX2, the first unit pixel PX1 and the second unit pixel PX2 can be optically isolated from adjacent unit pixels by the first light shielding structure G1 and the second light shielding structure G2.

FIGS. 3A to 3D are top views illustrating various examples of pixel groups PG_A, PG_B, PG_C, and PG_D based on some implementations of the disclosed technology. For convenience of description, the optical filters R, G, and B will herein be omitted for brevity.

In the pixel groups PG_A, PG_B, PG_C, and PG_D, each of which includes first to fourth unit pixels PX1, PX2, PX3, and PX4 arranged in a (2×2) matrix, when two unit pixels that are contained in the same pixel group and are adjacent to each other in the row direction of each of the pixel groups PG_A, PG_B, PG_C, and PG_D share the first microlens ML1, one unit pixel located at the left side of the center of each of the pixel groups PG_A, PG_B, PG_C, and PG_D may be referred to as the first unit pixel PX1, and one unit pixel located at the right side of the center of each of the pixel groups PG_A, PG_B, PG_C, and PG_D may be referred to as the second unit pixel PX2.

In other implementations, when two unit pixels adjacent to each other in the column direction of each of the pixel groups PG_A, PG_B, PG_C, and PG_D share the first microlens ML1, one unit pixel located at an upper side of the center of each of the pixel groups PG_A, PG_B, PG_C, and PG_D may be referred to as the first unit pixel PX1, and one unit pixel located at a lower side of the center of each of the pixel groups PG_A, PG_B, PG_C, and PG_D may be referred to as the second unit pixel PX2.

In addition, one unit pixel having a smaller light reception area among the remaining unit pixels except the first unit pixel PX1 and the second unit pixel PX2 may be referred to as the third unit pixel PX3, and one unit pixel having a larger light reception area among the remaining unit pixels except the first unit pixel PX1 and the second unit pixel PX2 may refer to as the fourth unit pixel PX4.

The positions of the third unit pixel PX3 and the fourth unit pixel PX4 may be interchanged in a certain pixel group PG_A, PG_B, PG_C, or PG_D. The second microlens ML2 may overlap with the third unit pixel PX3, and the third microlens ML3 may overlap with the fourth unit pixel PX4.

Figure 3A:
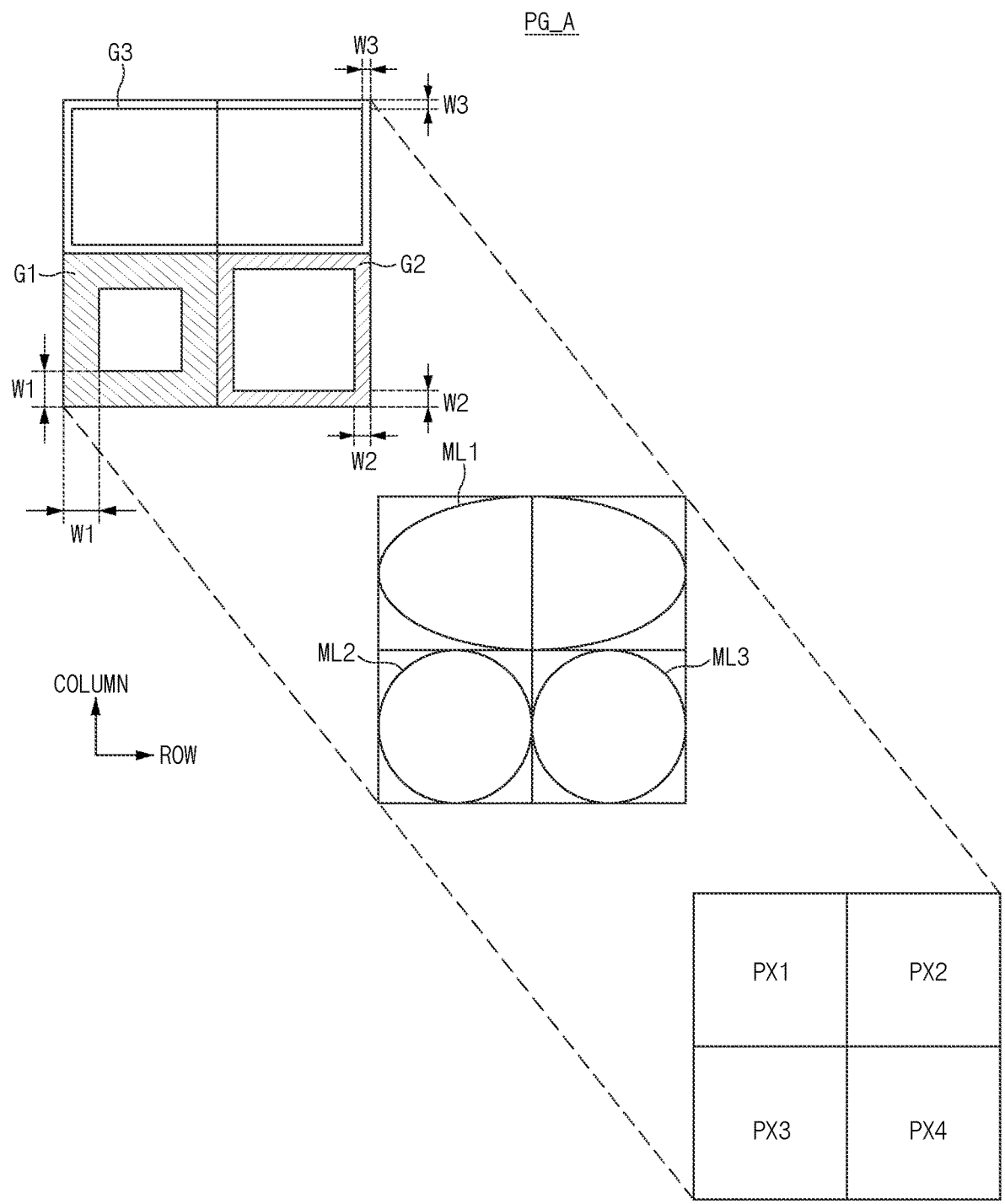
FIGS. 3A to 3D are top views illustrating various examples of pixel groups based on some implementations of the disclosed technology.

The first to fourth unit pixels PX1, PX2, PX3, and PX4 contained in the pixel group A (PG_A) shown in FIG. 3A may be arranged in substantially the same manner as in the first pixel group PG1 shown in FIG. 2.

The pixel group A (PG_A) may further include a third light shielding structure G3 formed along the outer edges of the first and second unit pixels PX1 and PX2. The third light shielding structure G3 may optically isolate the first unit pixel PX1 and the second unit pixel PX2 from adjacent unit pixels.

Since the third light shielding structure G3 is formed along the outer edges of the first and second unit pixels PX1 and PX2, no light shielding structure may be formed between the first unit pixel PX1 and the second unit pixel PX2.

When the light shielding structure is formed between the first unit pixel PX1 and the second unit pixel PX2, incident light that is incident near a boundary between the first unit pixel PX1 and the second unit pixel PX2 can be reflected by the light shielding structure.

When the light shielding structure formed between the first unit pixel PX1 and the second unit pixel PX2 reflects the incident light, distortion may occur in each of the signal generated by the first unit pixel PX1 and the signal generated by the second unit pixel PX2. Therefore, when the processor 200 generates phase difference data using the above-mentioned signals, it may be difficult for the image sensor to perform correct autofocusing.

The first light shielding structure G1 may have a first width W1 in the row direction (ROW) and the column direction (COLUMN) of the pixel group A (PG_A), the scope of the disclosed technology is not limited thereto, and it should be noted that the first light shielding structure G1 may have different widths in the row direction (ROW) and the column direction (COLUMN) of the pixel group A (PG_A) as needed.

The second light shielding structure G2 may have a second width W2 in the row direction (ROW) and the column direction (COLUMN) of the pixel group A (PG_A).

The third light shielding structure G3 may have a third width W3 in the row direction (ROW) and the column direction (COLUMN) of the pixel group A (PG_A).

In some implementations, the light reception areas of the respective unit pixels PX1, PX2, PX3, and PX4 may be adjusted in size by adjusting the first width W1, the second width W2, and the third width W3.

For example, the first width W1 may be larger than the second width W2. Since the first width W1 is larger than the second width W2, the light reception area of the third unit pixel PX3 may be smaller in size than the light reception area of the fourth unit pixel PX4.

When the third unit pixel PX3 has a smaller light reception area, the sensitivity of the third unit pixel PX3 reacting to the same incident light may be lower than the sensitivity of the fourth unit pixel PX4 reacting to the same incident light.

Therefore, image data (i.e., second image data) based on the signal generated by the third unit pixel PX3 may have lower sensitivity than image data (i.e., third image data) based on the signal generated by the fourth unit pixel PX4.

In addition, the third width W3 may be smaller than the second width W2. As described above, since the first microlens ML1 is formed to have a higher height than each of the second microlens ML2 and the third microlens ML3 and the third width W3 is smaller than the second width W2, the sensitivity of each of the first and second unit pixels PX1 and PX2 may be higher than the sensitivity of the third unit pixel PX3 or the fourth unit pixel PX4.

If the sensitivity of each of the first and second unit pixels PX1 and PX2 becomes higher, signals may be detected in the first unit pixel PX1 and the second unit pixel PX2 even when the intensity of incident light is low in level.

As a result, although the intensity of incident light is at a low level, the processor 200 can perform operations of the first mode.

In addition, as the sensitivity of each of the first and second unit pixels PX1 and PX2 becomes higher than the sensitivity of the third unit pixel PX3 or the fourth unit pixel PX4, the first image data (i.e., image data generated based on signals generated by the first and second unit pixels PX1 and PX2) generated by the processor 200 operating in the second mode may be image data that has higher-illuminance environments than each of the second image data generated based on the signal generated by the third unit pixel PX3 and the third image data generated based on the signal generated by the fourth unit pixel PX4.

The processor 200 may generate the HDR image by synthesizing or calculating the first image data, the second image data, and the third image data.

Figure 3B:
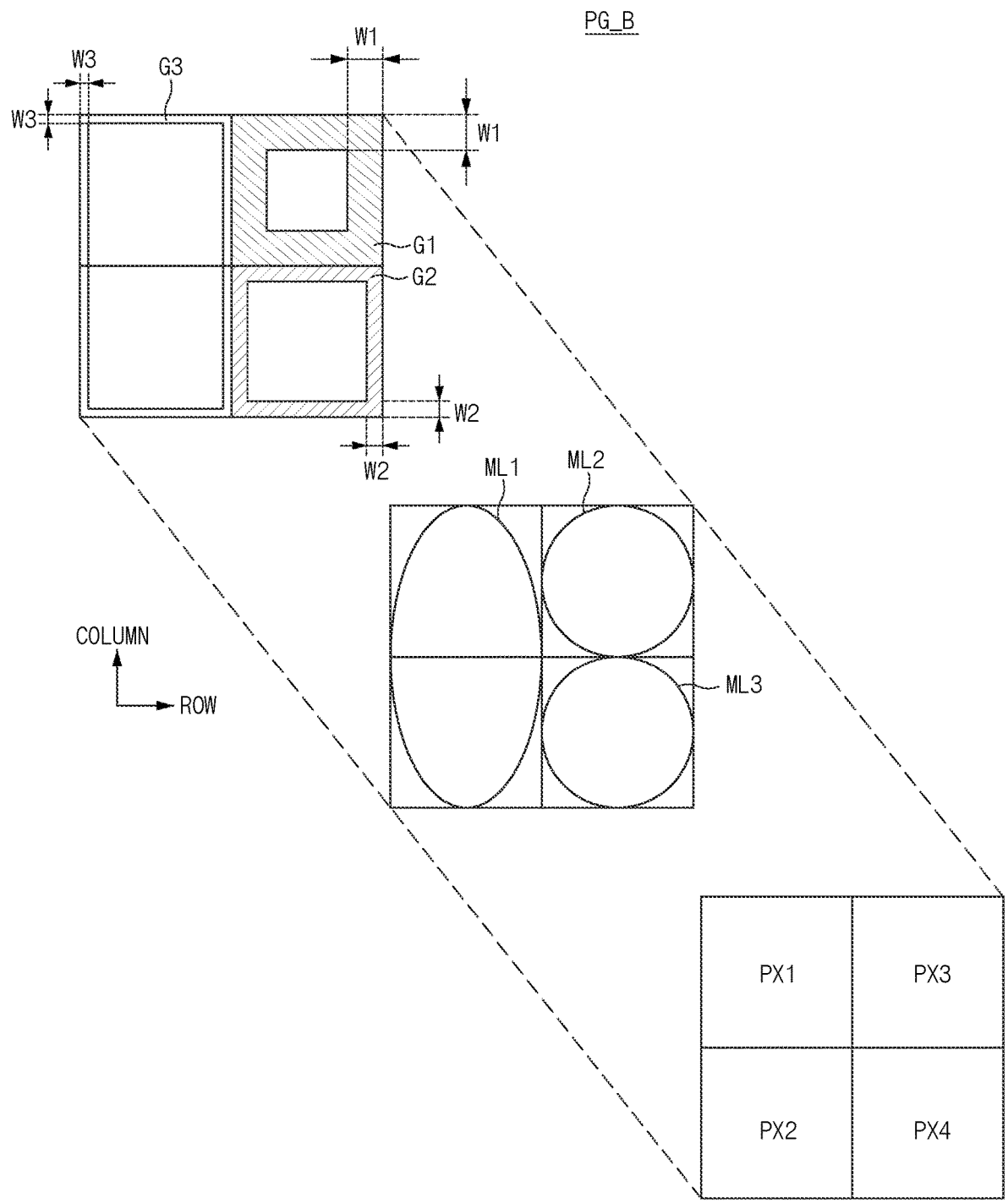

In the pixel group B (PG_B) shown in FIG. 3B, the first unit pixel PX1 and the second unit pixel PX2 may be arranged in the column direction of the pixel array. Since the first unit pixel PX1 and the second unit pixel PX2 are arranged in the column direction of the pixel array, the third unit pixel PX3 and the fourth unit pixel PX4 may also be arranged in the column direction of the pixel array.

The remaining characteristics (e.g., the shape of light shielding structures, etc.) other than arrangement of the unit pixels PX1, PX2, PX3, and PX4 in the pixel group B (PG_B) shown in FIG. 3B may be substantially identical in structure to those of the pixel group A (PG_A) shown in FIG. 3A.

Since the first unit pixel PX1 and the second unit pixel PX2 are arranged in the column direction of the pixel array, the processor 200 may acquire phase difference data in the column direction upon receiving signals generated by the first unit pixel PX1 and the second unit pixel PX2.

Figure 3C:
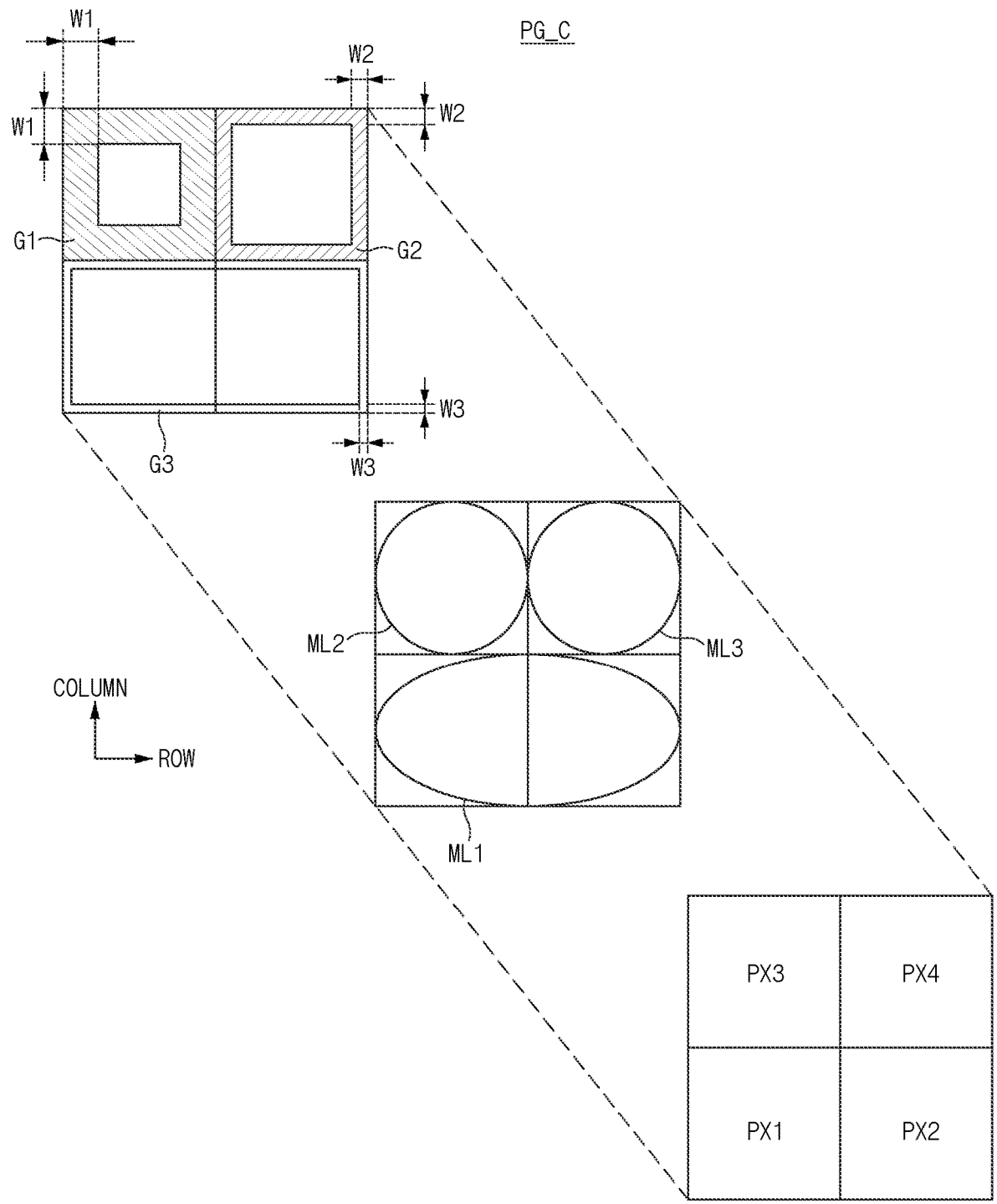
Figure 3D:
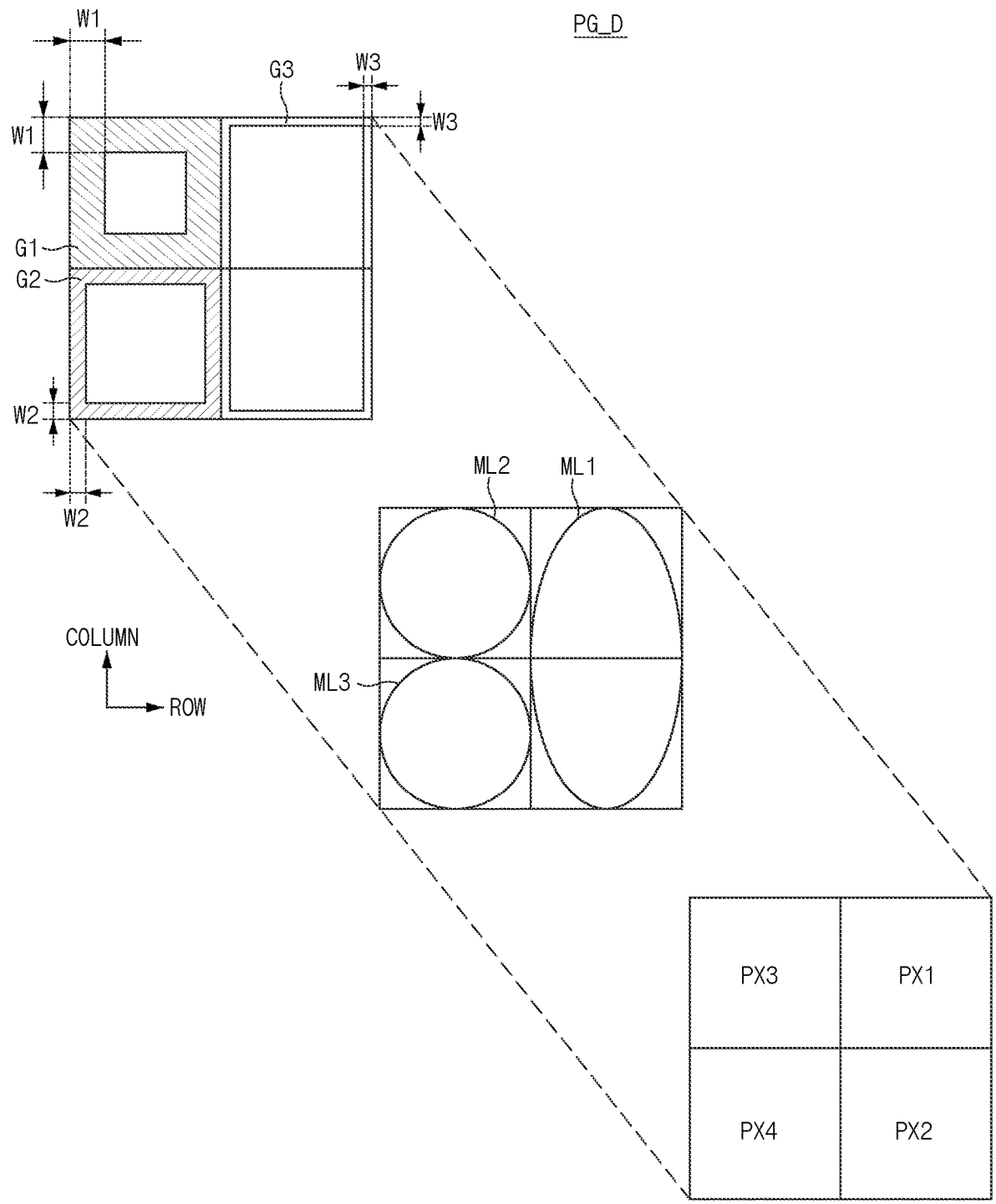

The pixel group C (PG_C) shown in FIG. 3C and the pixel group D (PG_D) shown in FIG. 3D illustrate other implementations in which the unit pixels PX1, PX2, PX3, and PX4 are arranged in the pixel group.

In the pixel group C (PG_C) shown in FIG. 3C, the first unit pixel PX1 and the second unit pixel PX2 may be arranged in the row direction of the pixel array. Since the first unit pixel PX1 and the second unit pixel PX2 are arranged in the row direction of the pixel array, the third unit pixel PX3 and the fourth unit pixel PX4 may also be arranged in the row direction of the pixel array.

In the pixel group D (PG_D) shown in FIG. 3D, the first unit pixel PX1 and the second unit pixel PX2 may be arranged in the column direction of the pixel array. Since the first unit pixel PX1 and the second unit pixel PX2 are arranged in the column direction of the pixel array, the third unit pixel PX3 and the fourth unit pixel PX4 may also be arranged in the column direction of the pixel array.

In some implementations, four pixel groups from among the pixel groups A, B, C, and D (PG_A, PG_B, PG_C, and PG_D) shown in FIGS. 3A to 3D may be arranged in a (2×2) matrix.

In addition, the pixel array may have a structure in which the (2×2) matrix is repeated.

For example, the pixel group A (PG_A) may be located at the first row and the first column of the (2×2) matrix, and the pixel group C (PG_C) may be located not only at the first row and the second column, but also at the second row and the first column of the (2×2) matrix. In addition, the pixel group B (PG_B) may be located at the second row and the second column of the (2×2) matrix.

From among the four pixel groups (i.e., one pixel group (PG_A), one pixel group (PG_B), and two pixel groups (PG_C)) contained in the (2×2) matrix, the first unit pixel PX1 and the second unit pixel PX2 contained in the pixel group B (PG_B) are arranged in the column direction of the pixel array, the processor 200 may acquire phase difference data in the column direction upon receiving signals generated by the pixel group B (PG_B) arranged in the entire pixel array in the first mode.

In addition, assuming that the optical filter array included in the pixel array is formed in the above-mentioned quad Bayer pattern, the optical filter included in each of the pixel group A (PG_A) and the pixel group B (PG_B) may be the second optical filter (G).

In the quad Bayer pattern, the number of unit pixels each including the second optical filter (G) is twice the number of unit pixels each including the first optical filter (R) or the number of unit pixels each including the second optical filter (B). As a result, although there is a difference between the signal generated by each of the first unit pixel PX1 and the second unit pixel PX2 of the pixel group B (PG_B) and the signal generated by another pixel group A (PG_A), the processor 200 may generate image data by easily performing interpolation in the second mode.

Figure 4:
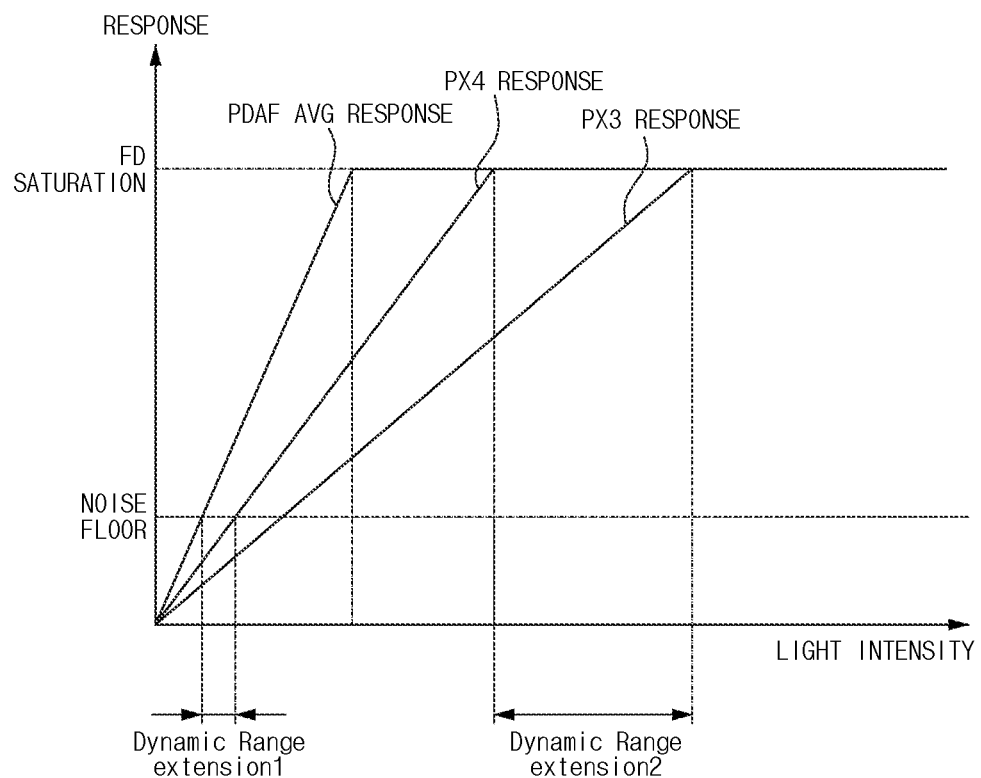
FIG. 4 is a graph illustrating examples of response signals based on intensity of incident light applied to each unit pixel included in a pixel group based on some implementations of the disclosed technology.

FIG. 4 is a graph illustrating examples of response signals for the intensity of incident light applied to each unit pixel included in a pixel group based on some implementations of the disclosed technology.

FIG. 4 is a graph illustrating pixel signals for generating image data. In more detail, an average response (PDAF AVG RESPONSE) of a first signal generated by the first unit pixel PX1 and a second signal generated by the second unit pixel PX2, a third signal response (PX3 RESPONSE) generated by the third unit pixel PX3, and a fourth signal response (PX4 RESPONSE) generated by the fourth unit pixel PX4 are illustrated in FIG. 4.

Signals generated by the first to fourth unit pixels PX1, PX2, PX3, and PX4 may have a significant value among a noise floor (NOISE FLOOR), a floating diffusion (FLOATING DIFFUSION), and a saturation signal (FD SATURATION). The floating diffusion (FLOATING DIFFUSION) and the saturation signal (FD SATURATION) may have the same value in the first to fourth unit pixels PX1, PX2, PX3, and PX4.

The slope of each of the average response (PDAF AVG RESPONSE) of the first and second signals, the third signal response (PX3 RESPONSE), and the fourth signal response (PX4 RESPONSE) may be proportional to the sensitivity of the unit pixels PX1, PX2, PX3, and PX4 configured to generate the above-mentioned signals.

If each unit pixel has a high sensitivity, the floating diffusion (FD) region can be saturated more quickly even when exposed to the low intensity of incident light.

Compared to the fourth signal graph (PX4 RESPONSE), the average response (PDAF AVG RESPONSE) of the first and second signals can more quickly reach the floating diffusion saturation signal (FD SATURATION). This is because each of the first unit pixel PX1 and the second unit pixel PX2 has a higher sensitivity than the fourth unit pixel PX4.

In addition, the lowest intensity of incident light capable of being detected by each of the first unit pixel PX1 and the second unit pixel PX2 may be lower than the lowest intensity of incident light capable of being detected by the fourth unit pixel PX4.

Therefore, when the processor 200 uses the average value of the signal of the first unit pixel PX1 and the signal of the second unit pixel PX2, the dynamic range for the low-intensity incident light can be extended in size more than the exemplary case of using only the signal of the fourth unit pixel PX4.

The processor 200 may acquire high-sensitivity image data using the average signal of the first and second signals. In the high-sensitivity image data, a dark portion of the external object (S) can be represented more accurately than image data obtained using the fourth signal only.

In addition, when the third signal graph (PX3 RESPONSE) is exposed to the stronger-intensity incident light as compared to the fourth signal graph (PX4 RESPONSE), the third signal graph (PX3 RESPONSE) can reach the floating diffusion saturation signal (FD SATURATION). This is because the third unit pixel PX3 has a lower sensitivity than the fourth unit pixel PX4 in a situation in which the light reception area of the third unit pixel PX3 is smaller in size than the light reception area of the fourth unit pixel PX4.

Therefore, when the processor 200 uses the signal of the third unit pixel PX3, the dynamic range for the stronger-intensity incident light can be extended in size more than the exemplary case of using the signal of the fourth unit pixel PX4 only.

The processor 200 may acquire low-sensitivity image data using the third signal. In the low-sensitivity image data, a bright portion of the external object (S) can be represented more accurately than image data obtained using the signal of the fourth unit pixel PX4 only.

The processor 200 uses the average signal of the first and second signals, the third signal, and the fourth signal, such that the processor 200 can generate high dynamic range (HDR) image data in which a dynamic range (contrast width) is extended more than the exemplary case of using the fourth signal only.

Figure 5:
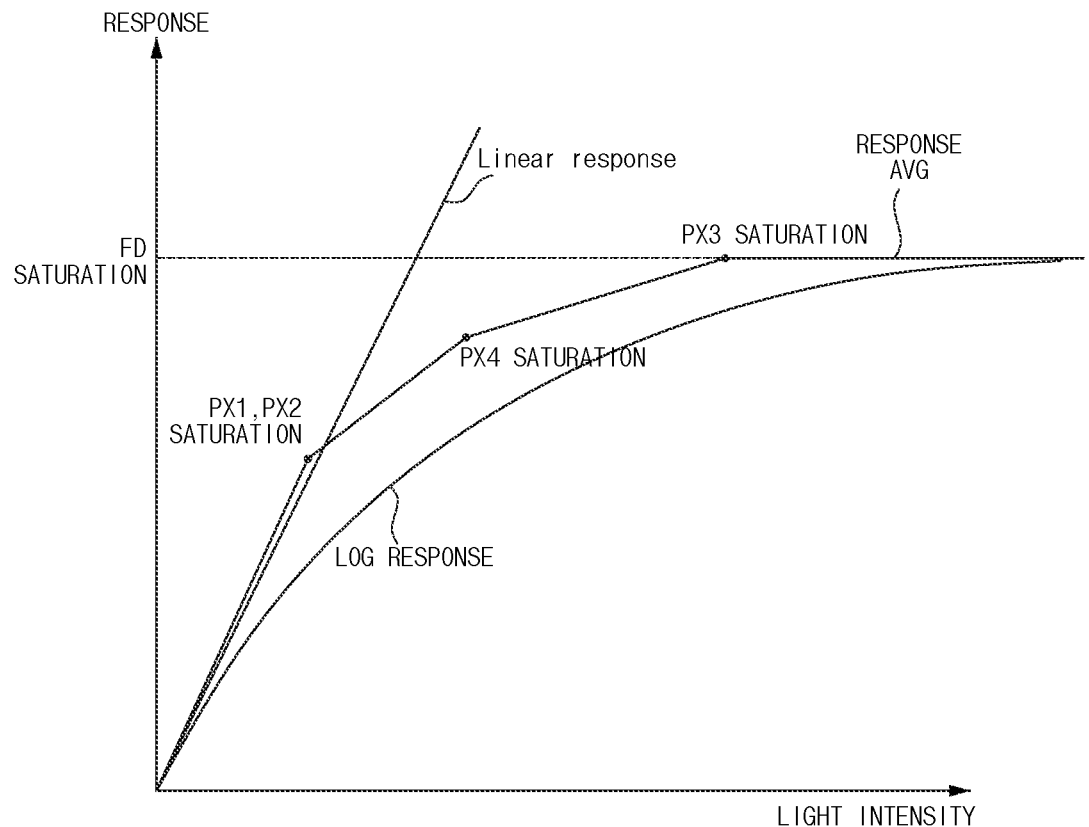
FIG. 5 is a graph illustrating a relationship between an average response corresponding to an average value of signal responses shown in FIG. 4 and an intensity of incident light based on some implementations of the disclosed technology.

FIG. 5 is a graph illustrating the result of comparison between the response average (RESPONSE AVG) corresponding to the average value of signal responses (PDAF AVG RESPONSE, PX3 RESPONSE, and PX4 RESPONSE) shown in FIG. 4 and the intensity of incident light based on some implementations of the disclosed technology.

FIG. 5 illustrates improvement of gradation characteristics of the image sensing device ISD based on some implementations of the disclosed technology.

The term "gradation" may refer to a difference in contrast between a bright portion and a dark portion of image data in a process of representing contrast of such image data. That is, good gradation may indicate that there is little difference in contrast between the bright portion and the dark portion of image data.

FIG. 5 exemplarily illustrates an exponential response (LOG RESPONSE) and a linear response (LINEAR RESPONSE) that are compared with the response average (RESPONSE AVG).

The linear response (LINEAR RESPONSE) may be identical to the average response (PDAF AVG RESPONSE) of the first and second signals shown in FIG. 4.

The exponential response (LOG RESPONSE) may schematically illustrate an exemplary response of the unit pixel having ideal response characteristics based on the intensity of incident light.

The slope of the average response (RESPONSE AVG) may be changed not only at a first point (PX1, PX2 SATURATION) where the first unit pixel PX1 and the second unit pixel PX2 are saturated, but also at a second point (PX4 SATURATION) where the fourth unit pixel PX4 is saturated.

The average response (RESPONSE AVG) indicates the average of responses having different slopes, such that the average response (RESPONSE AVG) may have different slopes in respective sections based on the intensity of incident light.

Therefore, the average response (RESPONSE AVG) may be more similar in shape to the exponential response (LOG RESPONSE) as compared to the linear response (LINEAR RESPONSE).

As the similarity between the average response (RESPONSE AVG) and the exponential response (LOG RESPONSE) becomes higher, the average response (RESPONSE AVG) may be similar in shape to the ideal response of the unit pixel, and the pixel signal change reacting to the changing intensity of incident light can be smoothly represented.

Thus, the image sensing device ISD based on some implementations of the disclosed technology can improve gradation characteristics of image data by additionally applying the third signal and the average signal of the first and second signals to the process of generating the image data.

As is apparent from the above description, the image sensing device based on some implementations of the disclosed technology can perform the phase-difference detection autofocus (PDAF) function. In addition, the image sensing device can generate the high dynamic range (HDR) image using a plurality of signals generated by one pixel group.

The image sensing device based on some implementations of the disclosed technology can use a plurality of signals generated by one pixel group, and can perform signal detection about the respective unit pixels contained in the pixel array only once using the plurality of signals, such that a high dynamic range (HDR) image can be generated and a higher-quality HDR image can be obtained.

Those skilled in the art will appreciate that the disclosed technology may be carried out in other specific ways than those set forth herein. In addition, claims that are not explicitly presented in the appended claims may be presented in combination as an embodiment or included as a new claim by a subsequent amendment after the application is filed.

Although a number of illustrative embodiments have been described, it should be understood that modifications of the disclosed embodiments and other embodiments can be devised based on what is described and/or illustrated in this patent document.

What is claimed is:

1. An image sensing device, comprising:
a plurality of pixel groups, each pixel group including first to fourth unit pixels that are configured to respond to incident light and generate electrical signals, and
wherein each of the first to fourth unit pixels of one of the plurality of pixel groups includes optical filters operable to transmit incident light corresponding to a same color,
wherein the first unit pixel and the second unit pixel that are included in each of the plurality of pixel groups are located adjacent to each other in a row direction of each of the plurality of pixel groups and include portions of a first microlens, and
wherein a light reception area of the third unit pixel of the one of the plurality of pixel groups has a size smaller than a size of a light reception area of the fourth unit pixel of the one of the plurality of pixel groups,
wherein the plurality of pixel groups further includes a first pixel group and a second pixel group that are located adjacent to each other in the row direction,
wherein a first microlens contained in the first pixel group is disposed in a first row of the first pixel group and a first microlens contained in the second pixel group is disposed in a second row of the second pixel group,
wherein each of the plurality of pixel groups further includes:
a first light shielding structure disposed along an outer edge of the third unit pixel;
a second light shielding structure disposed along an outer edge of the fourth unit pixel;
a third light shielding structure disposed along outer edges of the first unit pixel and the second unit pixel, and
wherein the first light shielding structure has a larger width than the second light shielding structure,
wherein the third light shielding structure has a smaller width than the second light shielding structure, and
wherein the first light shielding structure, the second light shielding structure and the third light shielding structure have openings having a square shape.

2. The image sensing device according to claim 1, wherein one of the optical filters is any one of a first optical filter configured to selectively pass red light, a second optical filter configured to selectively pass green light, or a third optical filter configured to selectively pass blue light.

3. The image sensing device according to claim 1, wherein:
a light reception area of the first unit pixel of the one of the plurality of pixel groups is identical in size to a light reception area of the second unit pixel of the one of the plurality of pixel groups.

4. The image sensing device according to claim 1, wherein:
the third unit pixel and the fourth unit pixel include a second microlens and a third microlens, respectively.

5. The image sensing device according to claim 4, wherein:
the first microlens is formed to have a higher height than either the second microlens or the third microlens.

6. An image sensing device comprising:
a plurality of pixel groups, each pixel group including first to fourth unit pixels that are configured to respond to incident light and generate signals, and
wherein each of the first to fourth unit pixels of one of the plurality of pixel groups includes optical filters operable to transmit incident light corresponding to a same color,
wherein the first unit pixel and the second unit pixel that are included in each of the plurality of pixel groups are located adjacent to each other and include portions of a first microlens,
wherein a light reception area of the third unit pixel of the one of the plurality of pixel group has a size smaller than a size of a light reception area of the fourth unit pixel of the one of the plurality of pixel groups, and
wherein:
the first unit pixel and the second unit pixel that are included in the one of the plurality of pixel groups are located adjacent to each other in a column direction of each of the pixel groups,
wherein the plurality of pixel groups further includes a first pixel group and a second pixel group that are located adjacent to each other in the column direction,
wherein a first microlens contained in the first pixel group is disposed in a first column of the first pixel group and a first microlens contained in the second pixel group is disposed in a second column of the second pixel group,
wherein each of the plurality of pixel groups further includes:
a first light shielding structure disposed along an outer edge of the third unit pixel;
a second light shielding structure disposed along an outer edge of the fourth unit pixel;
a third light shielding structure disposed along outer edges of the first unit pixel and the second unit pixel, and
wherein the first light shielding structure has a larger width than the second light shielding structure,
wherein the third light shielding structure has a smaller width than the second light shielding structure, and
wherein the first light shielding structure, the second light shielding structure and the third light shielding structure have openings having a square shape.

7. The image sensing device according to claim 6, wherein one of the optical filters is any one of a first optical filter configured to selectively pass red light, a second optical filter configured to selectively pass green light, or a third optical filter configured to selectively pass blue light.

8. The image sensing device according to claim 6, wherein:
a light reception area of the first unit pixel of the one of the plurality of pixel groups is identical in size to a light reception area of the second unit pixel of the one of the plurality of pixel groups.

9. The image sensing device according to claim 6, wherein:
the third unit pixel and the fourth unit pixel include a second microlens and a third microlens, respectively.

10. The image sensing device according to claim 9, wherein:
the first microlens is formed to have a higher height than either the second microlens or the third microlens.

11. An image sensing device, comprising:
a pixel array including pixel groups, each pixel group including unit pixels arranged in a (2×2) matrix and configured to respond to incident light and generate a signal corresponding to the incident light; and
a processor electrically coupled to the pixel groups and configured to process the signal generated by unit pixels included in the pixel groups,
wherein each pixel groups further includes:
first to fourth unit pixels that include optical filters configured to transmit incident light of a same color;
a microlens disposed to overlap with the first unit pixel and the second unit pixel, and
wherein a light reception area of the third unit pixel has a size smaller than a size of a light reception area of the fourth unit pixel,
wherein the processor is configured to generate phase difference data indicative of a phase difference between a first path for the incident light to reach the first unit pixel and a second path for the incident light to reach the second unit pixel,
wherein the first unit pixel and the second unit pixel that are included in each of the plurality of pixel groups are located adjacent to each other in a row direction of each of the plurality of pixel groups,
wherein the plurality of pixel groups further includes a first pixel group and a second pixel group that are located adjacent to each other in the row direction,
wherein a first microlens contained in the first pixel group is disposed in a first row of the first pixel group and a first microlens contained in the second pixel group is disposed in a second row of the second pixel group,
wherein each of the plurality of pixel groups further includes:
a first light shielding structure disposed along an outer edge of the third unit pixel;
a second light shielding structure disposed along an outer edge of the fourth unit pixel;
a third light shielding structure disposed along outer edges of the first unit pixel and the second unit pixel, and
wherein the first light shielding structure has a larger width than the second light shielding structure,
wherein the third light shielding structure has a smaller width than the second light shielding structure, and
wherein the first light shielding structure, the second light shielding structure and the third light shielding structure have openings having a square shape.

12. The image sensing device according to claim 11, wherein the processor is configured to operate to generate first image data based on the signals generated by the first unit pixel and the second unit pixel.

13. The image sensing device according to claim 12, wherein the processor is further configured to generate second image data based on the signal generated by the third unit pixel, and generate third image data based on the signal generated by the fourth unit pixel.

14. The image sensing device according to claim 13, wherein the processor is configured to generate a high dynamic range (HDR) image using the first to third image data.

* * * * *